(12) United States Patent
Wilkening

(10) Patent No.: US 6,452,768 B1
(45) Date of Patent: Sep. 17, 2002

(54) CIRCUIT ARRANGEMENT FOR PROTECTING INTEGRATED CIRCUITS AGAINST ELECTROSTATIC DISCHARGES

(75) Inventor: Wolfgang Wilkening, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/508,330
(22) PCT Filed: Aug. 11, 1998
(86) PCT No.: PCT/DE98/02294
§ 371 (c)(1),
(2), (4) Date: Jun. 14, 2000
(87) PCT Pub. No.: WO99/13549
PCT Pub. Date: Mar. 18, 1999

(30) Foreign Application Priority Data

Sep. 10, 1997 (DE) .......................................... 197 39 683

(51) Int. Cl.[7] ................................................ H02H 9/00
(52) U.S. Cl. ......................... 361/56; 361/111; 361/118; 361/91.1
(58) Field of Search ............................ 361/56, 58, 111, 361/115, 118, 119, 91.1

(56) References Cited

U.S. PATENT DOCUMENTS 5,543,650 A * 8/1996 Au et al. ..................... 257/355
5,625,522 A * 4/1997 Watt ............................ 361/111
5,959,820 A * 9/1999 Ker et al. .................... 361/111

FOREIGN PATENT DOCUMENTS

DE 44 39 125 5/1996

OTHER PUBLICATIONS

Mack WD et al; New ESD Protection Schemes for BICMOS Processes with Application to Cellular Radio Designs; Proceedings of the International Symposium on Circuits and Systems, San Diego, May 10–13, 1992; Institute of Electrical and Electronics Engineers, pp. 2699–2702.

* cited by examiner

Primary Examiner—Stephen W. Jackson
(74) Attorney, Agent, or Firm—Kenyon & Kenyon

(57) ABSTRACT

A circuit arrangement for the protection of integrated circuits against electrostatic discharges is described, the circuit arrangement having a first MOS protective transistor, a second MOS transistor being connected between the gate terminal and source terminal of the first MOS protective transistor, the second MOS transistor being connected with its drain terminal to the gate terminal of the first MOS transistor, being connected with its source terminal to the source terminal of the first MOS transistor, and being connected with its gate terminal to the drain terminal of the first MOS transistor. At least one diode is connected between the source terminal of the second MOS transistor and the source terminal of the MOS protective transistor.

4 Claims, 1 Drawing Sheet

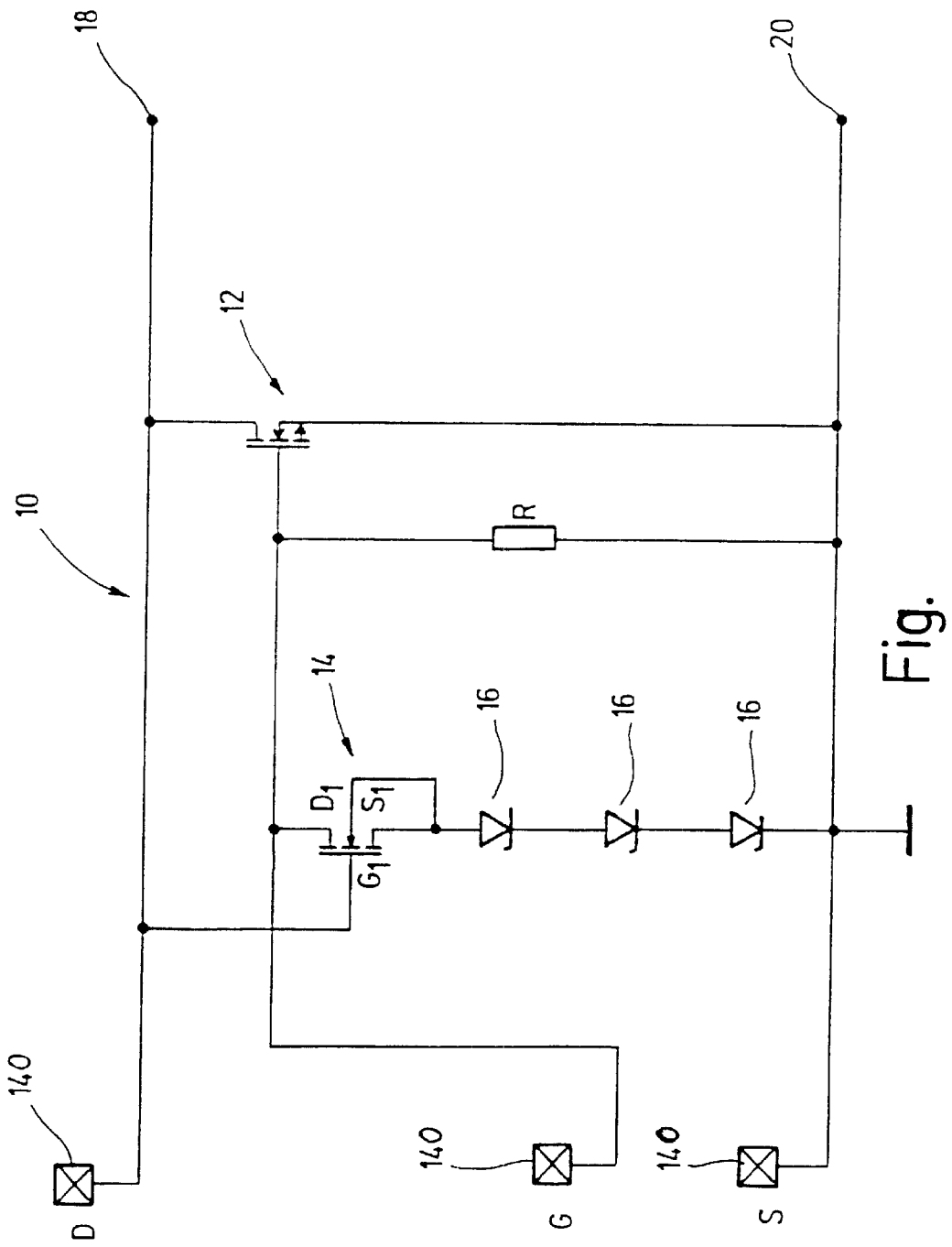

CIRCUIT ARRANGEMENT FOR PROTECTING INTEGRATED CIRCUITS AGAINST ELECTROSTATIC DISCHARGES

FIELD OF THE INVENTION

The invention relates to a circuit arrangement for the protection of integrated circuits against electrostatic discharges on a component of such integrated circuits.

BACKGROUND INFORMATION

It is known that electrostatic discharges can occur in the manufacture of integrated circuits, in the case of hybrid processes in particular, in which various production methods, for example, the joint production of bipolar and MOS transistors is to take place. These electrostatic discharges result in voltage peaks which can result in destruction of the integrated circuits.

SUMMARY OF THE INVENTION

To protect integrated circuits, it is possible to use MOS protective transistors, its gate terminal is connected to the source terminal of the protective transistor via a break distance of an additional MOS transistor. A voltage pulse brought about by an electrostatic discharge is present at the drain terminal of the protective transistor and at the gate terminal of the second MOS transistor. In this connection, use is made of the effect that, with varying gate voltage, the breakdown voltage of an MOS transistor has a minimum at approximately 0.5 volts above a threshold voltage of the MOS transistor. This breakdown voltage represents the operating point for an effective protection against electrostatic discharges. If a voltage pulse now occurs as the result of an electrostatic discharge, the gate voltage of the protective transistor is raised briefly above the threshold voltage as the result of a gate-drain capacitance. At the same time, however, the second MOS transistor also switches through since the voltage pulse is present at its gate terminal so that the gate voltage of the protective transistor drops again below the threshold voltage. Thus the electrostatic discharge passes through the operating point of the protective transistor only briefly during the occurrence of the voltage pulse, thus resulting in an unreliable design.

The circuit arrangement according to the present invention offers the advantage that, in addition to ensuring an effective protection against electrostatic discharges in a simple manner, it is possible to adjust the operating point of the protective transistor in a controlled manner for the total duration of an electrostatic discharge pulse. Due to the fact that at least one diode is connected in forward direction between the source terminal of the second MOS transistor and the source terminal of the MOS transistor, the effect of the diode, which is known per se, can be used to maintain voltages at a nearly constant level. As a result, the gate voltage of the MOS transistor is maintained above the threshold voltage for the entire duration of the pulse of the electrostatic discharge, making it possible to reduce the voltage pulse of the electrostatic discharge in a controlled manner via the protective transistor.

Instead of the diode, a suitable Zener diode can also be connected in reverse direction.

BRIEF DESCRIPTION OF THE DRAWINGS

The FIGURE shows the circuit arrangement according to the present invention.

DETAILED DESCRIPTION

A protective circuit 10 for the protection of integrated circuits against electrostatic discharges is shown in the FIGURE. Protective circuit 10 includes an MOS protective transistor 12, whose drain terminal D, gate terminal G and source terminal S each can be contacted via contact pads 140. Drain terminal D of MOS protective transistor 12 is connected to a gate terminal $G_1$ of an MOS field oxide transistor 14, whose drain terminal $D_1$ is connected to gate terminal G of protective transistor 12 and whose source terminal $S_1$ is connected via a series connection of diodes 16 to source terminal S of protective transistor 12. A relatively high-resistance resistor R is connected between gate terminal G and source terminal S of MOS protective transistor 12.

According to additional embodiments, the number of diodes 16 can be varied. Thus, for example, only one diode 16, two diodes 16 or even more than three diodes 16 can be connected in series.

A circuit arrangement to be protected (which is not shown) is connected at output terminals 18 and 20 of protective circuit 10.

The following is attained by the circuit arrangement according to the present invention:

With a positive voltage pulse present at drain terminal D as the result of an electrostatic discharge, the gate voltage of protective transistor 12—via a gate-drain capacitance of transistor 12—is increased above a threshold voltage of transistor 12 so that transistor 12 becomes conductive in order to drain off the voltage pulse of the electrostatic discharge. At the same time, the positive voltage pulse of the electrostatic discharge trips transistor 14 so that the gate voltage of transistor 12 is present at diodes 16. Diodes 16 are designed in such a way that the gate voltage is higher than a forward voltage of diodes 16 so that even though there is a rapid current rise, the gate voltage stays essentially constant. This brings it about that the gate voltage of transistor 12 does not drop below the threshold voltage of transistor 12 and it thus continues to be conductive for the total pulse duration of the voltage pulse resulting from the electrostatic discharges. This makes a controlled adjustment of the operating point possible for an effective protection of integrated circuits against electrostatic discharges over the total duration of the voltage pulse. Moreover, the circuit arrangement requires only a small amount of space in integrated circuits for protective circuit 10 so that it can be implemented economically.

Resistor R serves to define a gate voltage of MOS protective transistor 12 if no voltage pulse is present as the result of an electrostatic discharge. Without resistor R, the gate voltage would be variable and could, for example, be higher than a switching voltage of the MOS protective transistor. Resistor R draws the gate voltage of protective circuit 10 to ground in its quiescent state.

What is claimed is:

1. A circuit arrangement for protecting an integrated circuit against an electrostatic discharge, comprising:

a first MOS protective transistor having a gate terminal, a drain terminal and a source terminal;

a second MOS transistor having a gate terminal, a drain terminal and a source terminal, the drain terminal of the second transistor being connected to the gate terminal of the first transistor, the gate terminal of the second transistor being connected to the drain terminal of the first transistor; and at least one diode coupled between the source terminal of the second transistor and the source terminal of the first transistor, so that an overvoltage present at the drain terminal of the first transistor switches the first transis tor into a breakdown operation until the overvoltage has decayed.

2. The circuit arrangement according to claim 1, wherein the at least one diode includes a series connection of diodes connected between the source terminal of the second transistor and the source terminal of the first transistor.

3. The circuit arrangement according to claim 1, wherein the at least one diode includes a series connection of three diodes connected between the source terminal of the second transistor and the source terminal of the first transistor.

4. The circuit arrangement according to claim 1, wherein the at least one diode includes a Zener diode connected in a reverse direction.

* * * * *